(12) United States Patent
Chen et al.

(10) Patent No.: US 7,960,697 B2
(45) Date of Patent: Jun. 14, 2011

(54) ELECTRON BEAM APPARATUS

(75) Inventors: Zhongwei Chen, San Jose, CA (US); Weiming Ren, San Jose, CA (US); Joe Wang, Campbell, CA (US); Xuedong Liu, Cupertino, CA (US); Juying Dou, San Jose, CA (US); Fumin He, Beijing (CN); Feng Cao, Beijing (CN); Yan Ren, Beijing (CN); Xiaoli Guo, Beijing (CN); Wei He, Beijing (CN); Qingpo Xi, Beijing (CN)

(73) Assignee: Hermes-Microvision, Inc., Hsinchu (TW)

( * ) Notice: Subject to any disclaimer, the term of this patent is extended or adjusted under 35 U.S.C. 154(b) by 260 days.

(21) Appl. No.: 12/257,304

(22) Filed: Oct. 23, 2008

(65) Prior Publication Data

US 2010/0102227 A1    Apr. 29, 2010

(51) Int. Cl.
*H01J 49/44*    (2006.01)
(52) U.S. Cl. ..... 250/310; 250/397; 250/398; 250/492.1; 250/492.22; 250/396 ML
(58) Field of Classification Search .......... None
See application file for complete search history.

(56) References Cited

U.S. PATENT DOCUMENTS

| | | | |
|---|---|---|---|
| 4,068,123 A | 1/1978 | Kokubo | |
| 4,675,524 A | 6/1987 | Frosien et al. | |
| 4,700,075 A | 10/1987 | Kurz et al. | |
| 4,713,543 A | 12/1987 | Feuerbaum et al. | |
| 4,728,790 A | 3/1988 | Plies | |
| 4,808,821 A | 2/1989 | Feuerbaum et al. | |
| 4,818,874 A | 4/1989 | Ishikawa | |
| 4,831,266 A | 5/1989 | Frosien et al. | |
| 4,926,054 A | 5/1990 | Frosien | |
| 5,004,918 A | 4/1991 | Tsuno | |
| 5,198,675 A | 3/1993 | Hikita et al. | |
| 5,498,874 A * | 3/1996 | Miyoshi et al. | 250/397 |
| 5,665,968 A | 9/1997 | Meisburger et al. | |
| 5,717,204 A | 2/1998 | Meisburger et al. | |

(Continued)

FOREIGN PATENT DOCUMENTS

DE    3925949 A1    2/1991

OTHER PUBLICATIONS

Ludwig Reimer, "Image Formation in Low-Voltage Scanning Electron Microscopy", SPIE Optical Engineering Press, Tutorial Texts vol. TT12, 1993, 16 total pages (pp. 12, 13, 28-41, 88-101).

(Continued)

*Primary Examiner* — David A Vanore
(74) *Attorney, Agent, or Firm* — Sawyer Law Group, P.C.

(57) ABSTRACT

The present invention relates to a charged particle beam apparatus which employs a scanning electron microscope for sample inspection and defect review.

The present invent provides solution of improving imaging resolution by utilizing a field emission cathode tip with a large tip radius, applying a large accelerating voltage across ground potential between the cathode and anode, positioning the beam limit aperture before condenser lens, utilizing condenser lens excitation current to optimize image resolution, applying a high tube bias to shorten electron travel time, adopting and modifying SORIL objective lens to ameliorate aberration at large field of view and under electric drifting and reduce the urgency of water cooling objective lens while operating material analysis.

The present invent provides solution of improving throughput by utilizing fast scanning ability of SORIL and providing a large voltage difference between sample and detectors.

20 Claims, 7 Drawing Sheets

U.S. PATENT DOCUMENTS

| | | | |
|---|---|---|---|
| 5,872,358 A | 2/1999 | Todokoro et al. | |
| 6,194,729 B1 | 2/2001 | Weimer | |
| 6,365,896 B1 | 4/2002 | van der Mast | |
| 6,380,546 B1 | 4/2002 | Petrov et al. | |
| 6,392,231 B1 * | 5/2002 | Chen | 250/310 |
| 6,407,387 B1 | 6/2002 | Frosien et al. | |
| 6,426,501 B1 | 7/2002 | Nakagawa | |
| 6,462,467 B1 * | 10/2002 | Russ | 313/495 |
| 6,463,124 B1 * | 10/2002 | Weisman et al. | 378/136 |
| 6,545,277 B1 | 4/2003 | Kella et al. | |
| 6,605,805 B2 * | 8/2003 | Chen | 250/310 |
| 6,617,579 B2 | 9/2003 | Yonezawa | |
| 6,642,520 B2 | 11/2003 | Kimura et al. | |
| 6,768,324 B1 | 7/2004 | Yamada et al. | |
| 6,775,452 B2 | 8/2004 | Howells | |
| 6,853,143 B2 | 2/2005 | Nakasuji et al. | |
| 6,855,938 B2 | 2/2005 | Preikszas et al. | |
| 6,960,766 B2 * | 11/2005 | Chen | 850/1 |
| 6,972,412 B2 | 12/2005 | Scholtz et al. | |
| 6,975,125 B2 | 12/2005 | Yamada et al. | |
| 7,067,807 B2 | 6/2006 | Petrov et al. | |
| 7,098,468 B2 * | 8/2006 | Aloni et al. | 250/492.22 |
| 7,161,667 B2 | 1/2007 | Meeks et al. | |
| 7,180,317 B2 | 2/2007 | Hollman | |
| 7,312,449 B2 | 12/2007 | Nakasuji et al. | |
| 7,385,195 B2 | 6/2008 | Yamada et al. | |
| 7,521,700 B2 * | 4/2009 | Aloni et al. | 250/492.22 |
| 7,544,937 B2 | 6/2009 | Frosien | |
| 7,598,499 B2 | 10/2009 | Platzgummer | |
| 7,612,337 B2 | 11/2009 | Suzuki et al. | |
| 7,645,989 B2 | 1/2010 | Bihr et al. | |
| 7,652,263 B2 | 1/2010 | Feuerbaum | |
| 7,705,298 B2 | 4/2010 | Liu et al. | |
| 7,705,301 B2 | 4/2010 | Tseng et al. | |
| 7,759,653 B2 * | 7/2010 | Chen et al. | 250/396 ML |
| 2003/0155509 A1 | 8/2003 | Nakasuji et al. | |
| 2004/0239347 A1 | 12/2004 | Yamada et al. | |
| 2005/0023491 A1 | 2/2005 | Young et al. | |
| 2005/0133733 A1 | 6/2005 | Nakasuji et al. | |
| 2006/0202119 A1 | 9/2006 | Yamada et al. | |
| 2006/0243918 A1 * | 11/2006 | Aloni et al. | 250/492.2 |
| 2008/0067380 A1 | 3/2008 | Ozawa et al. | |
| 2008/0099693 A1 | 5/2008 | Platzgummer | |
| 2008/0217529 A1 | 9/2008 | Sukegawa et al. | |
| 2008/0315094 A1 | 12/2008 | Wang et al. | |
| 2009/0090866 A1 | 4/2009 | Zhang et al. | |
| 2009/0242792 A1 | 10/2009 | Hosoya et al. | |
| 2009/0294664 A1 * | 12/2009 | Chen et al. | 250/310 |
| 2010/0028235 A1 * | 2/2010 | Qin et al. | 423/263 |
| 2010/0102227 A1 | 4/2010 | Chen et al. | |
| 2010/0118310 A1 | 5/2010 | Matsui | |
| 2010/0150429 A1 * | 6/2010 | Jau et al. | 382/149 |

OTHER PUBLICATIONS

K. Tsuno, "Aberration Analysis of a Wien Filter for Electrons", Wissenschaftliche Verlagsgesellschaft mbH Stuugart, vol. 89-No. 1, 1991, pp. 31-40.

Ronnie Porat, et al., "SEM-based methodology for root cause analysis of wafer edge and bevel defects", IEEE/SEMI Advanced Semiconductor Manufacturing Conference, pp. 11-12, 2008.

Jaime D. Morillo, et al., "Edge and Bevel Automated Defect Inspection for 300mm Production Wafers in Manufacturing", IEEE/SEMI Advanced Semiconductor Manufacturing Conference, pp. 1-4, 2005.

* cited by examiner

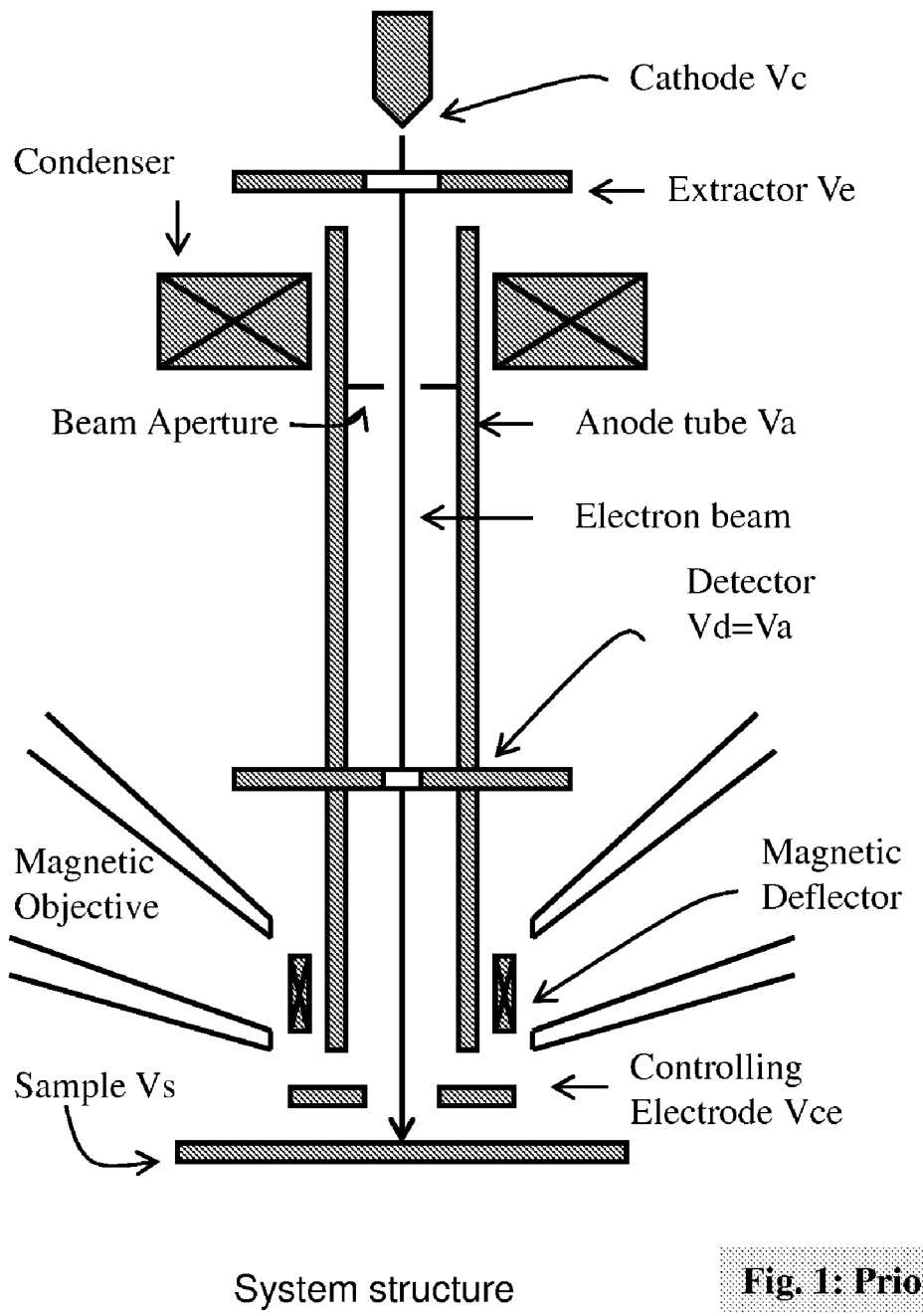
System structure
Fig. 1: Prior art

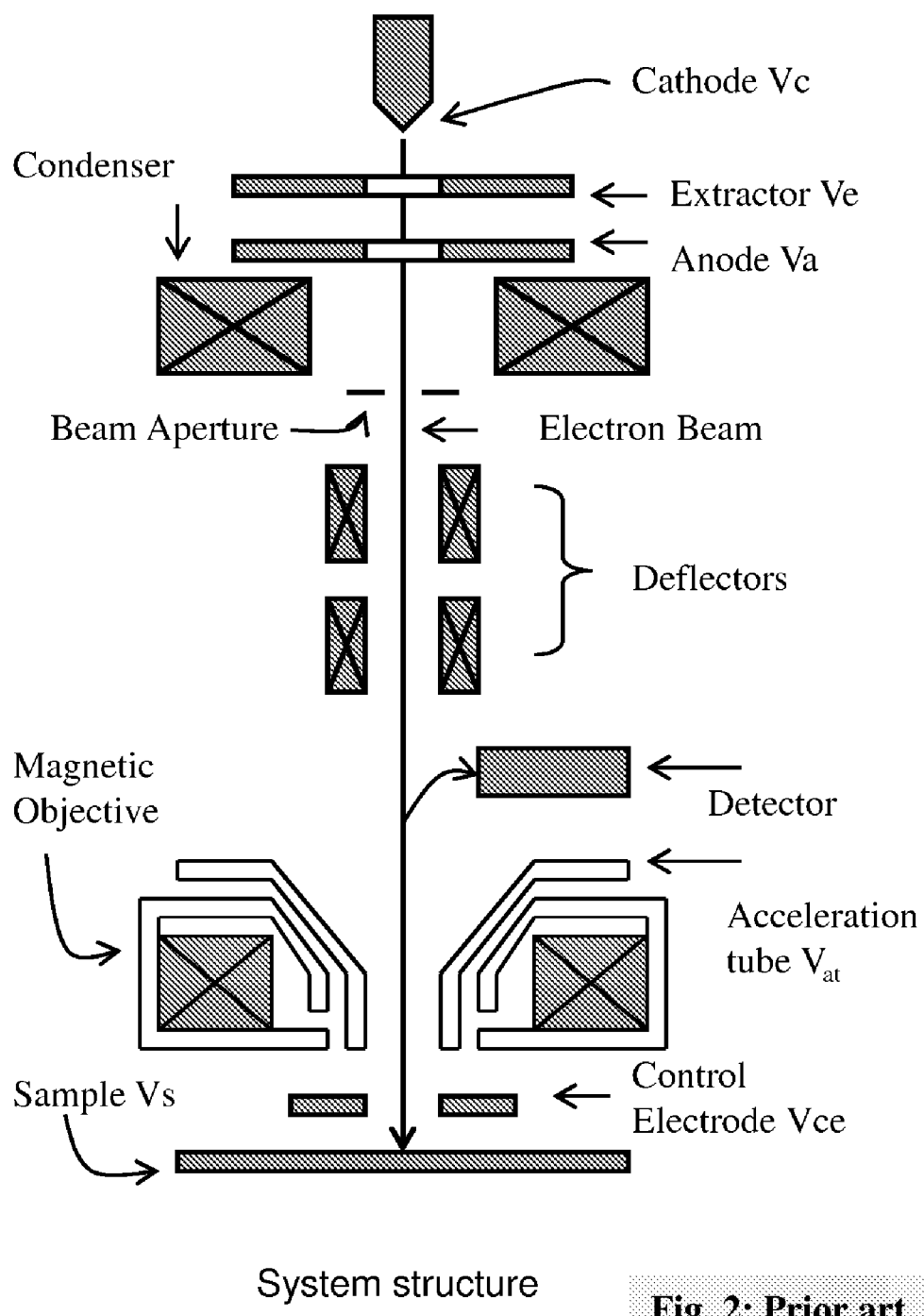
Fig. 2: Prior art

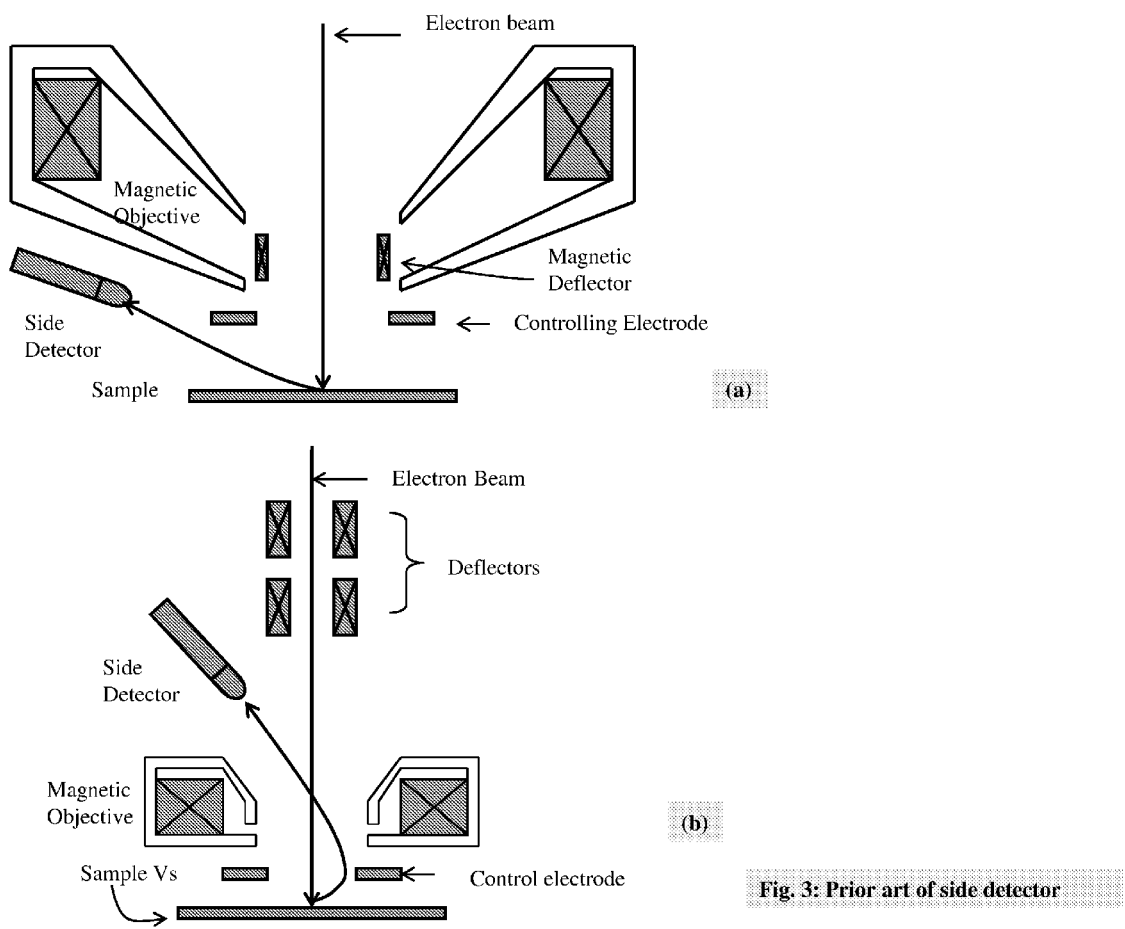
Fig. 3: Prior art of side detector

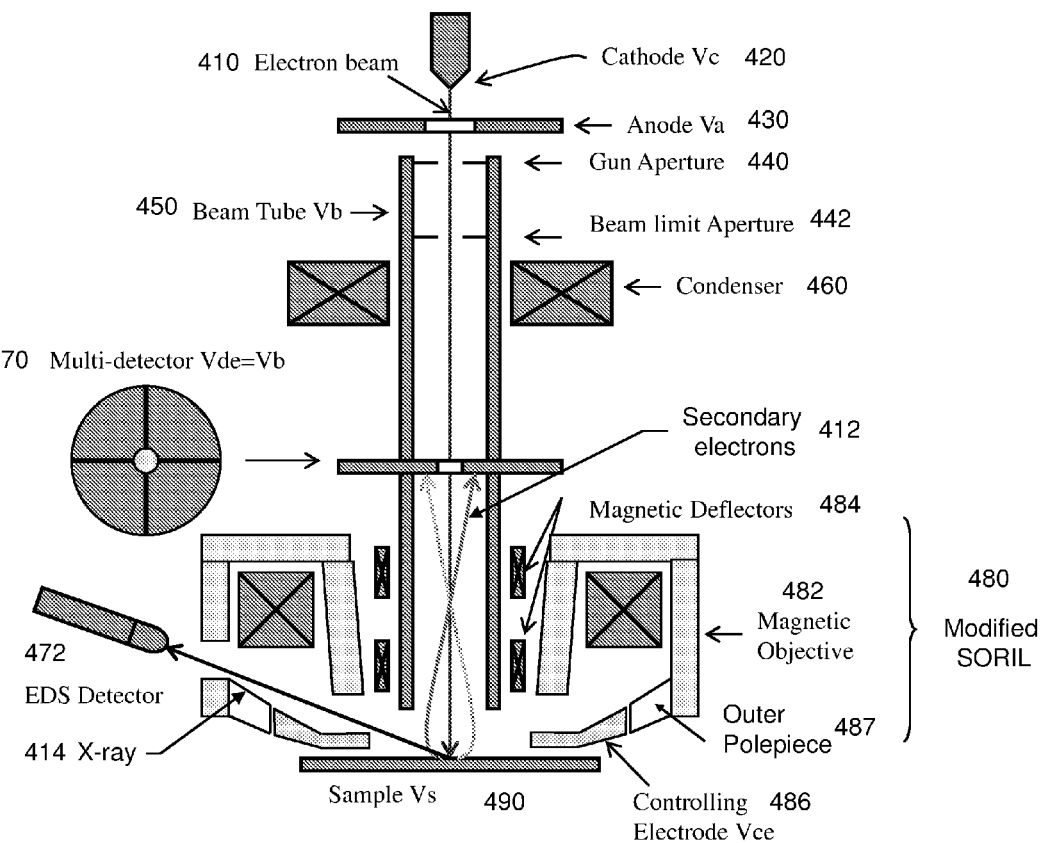
Fig. 4: System Structure of the first embodiment of Present Invention

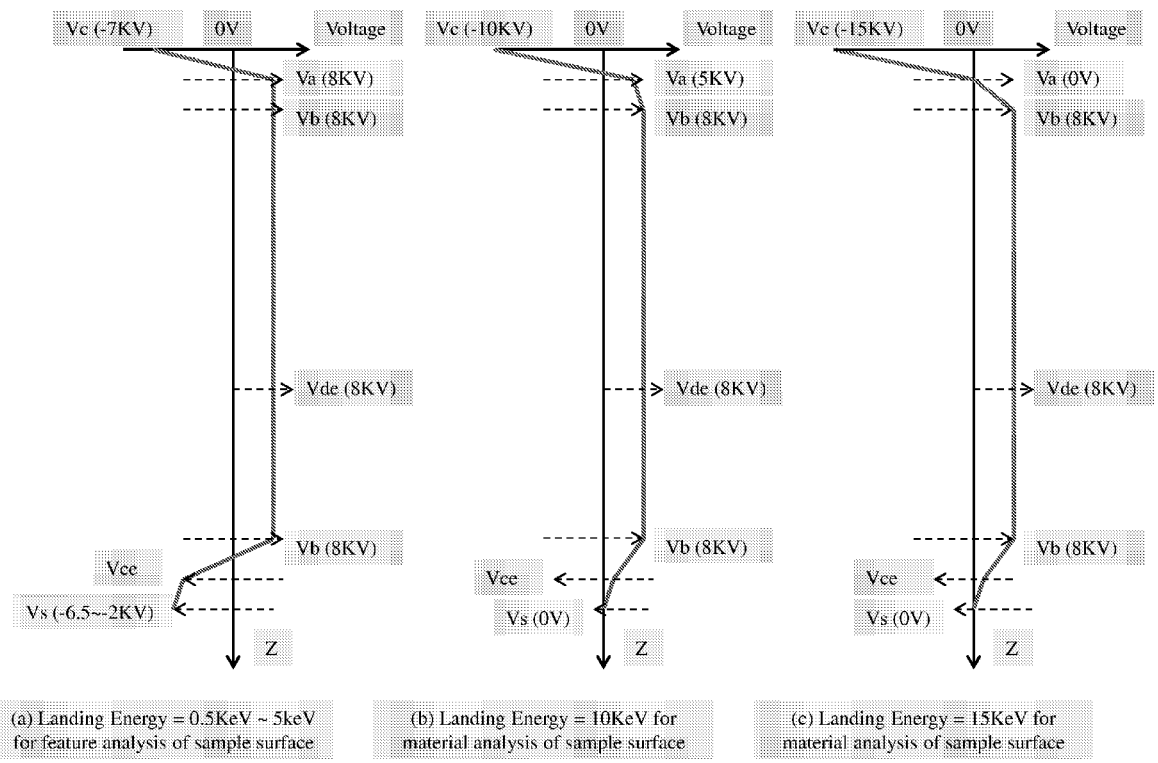

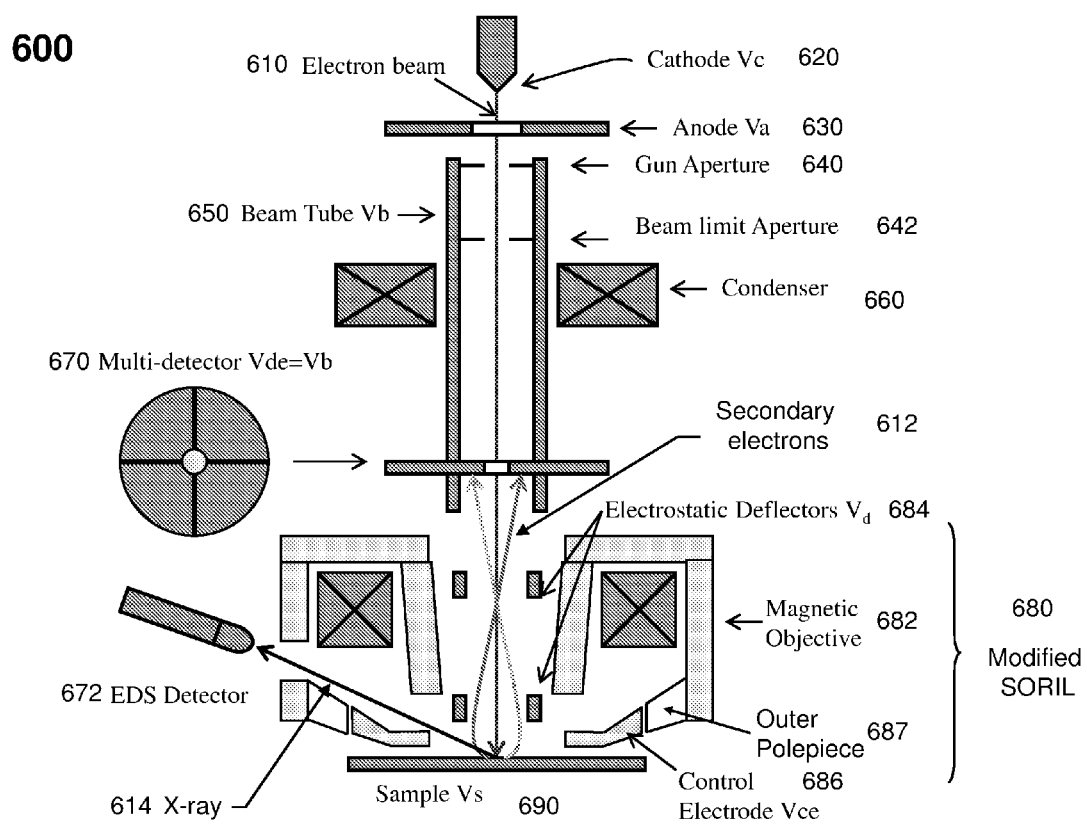
Fig. 6: System Structure of the secondary embodiment of Present Invention

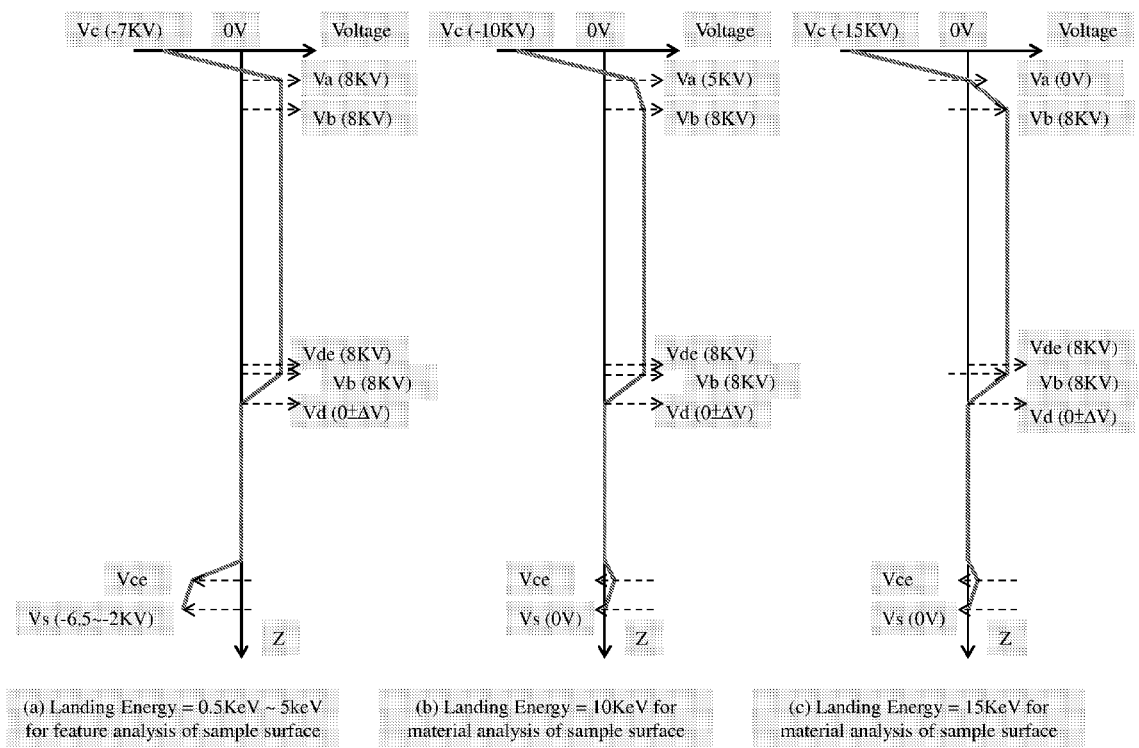
Fig. 7: Excitation Voltages of the second embodiment of Present Invention

ELECTRON BEAM APPARATUS

RELATED APPLICATIONS

Under 35 USC §120, this application is a Non-Provisional application and is related to co-pending U.S. patent application Ser. No. 12/130,879, filed on May 30, 2008, entitled "AN ELECTRON BEAM APPARATUS"; to U.S. patent application Ser. No. 11/668,846, filed on Jan. 30, 2007, entitled "CHARGE PARTICLE DETECTION DEVICES, all of which are incorporated herein by reference.

FIELD OF THE INVENTION

The present invention relates to a charged particle beam apparatus which employs a scanning electron microscope for sample inspection and defect review. However, it would be recognized that the invention has a much broader range of applicability.

BACKGROUND OF THE INVENTION

A charged particle beam apparatus typically employs a scanning electron microscopy (SEM), which is a known technique used in semiconductor manufacturing. Defects can occur on the mask or wafer during the semiconductor fabrication process. These defects impact yield to a great degree. Defect inspection systems and defect review systems are two significant ways to monitor semiconductor yield management.

A defect inspection system detects particles, pattern defects, and process-induced defects, and typically detection results from the inspection systems are fed to defect review systems. A defect review system further analyzes defect root causes. For most of the charged particle systems, imaging resolution (which determines the detectable defect size) and throughput (which determine how many defects can be detected out in unit time) are always major concerns during sample inspection and defects review. In a defect review system, stereo imaging detection for topography analysis (which tells whether defects are protrusion or depression) is also a required function. FIG. 1 is an inspection column disclosed by Petrov et al. in U.S. Pat. No. 7,067,807 which is incorporated by reference as if fully set forth herein, and FIG. 2 is a high resolution scanning electron microscope (SEM) disclosed by Todokoro et al. in U.S. Pat. No. 5,872,358 which is incorporated by reference as fully set forth herein.

One of the common goals of all imaging systems consists of increasing the image resolution. Image resolution depends principally on the spot size of the electron beam impinging onto the sample. In order to reduce the spot size of the electron beam up to nanometers, a highly accelerated electron beam is typically produced using accelerating voltages of several tens of kilovolts and more. Electron optics produces smaller aberrations when the electrons move with higher kinetic energy. However, radiation damage to the sample is another subject to consider while utilizing high kinetic energy electron beam. Therefore the electron beam is decelerated just prior to impinging onto the sample surface.

Throughput depends principally on how fast the imaging spot can be scanning and how large the field of view is to be scanning through. Electron optics produces large off-axis aberrations when the field of view becomes large. Comparatively, magnetic scanning deflectors produce smaller deflection off-axis aberrations but can not scan with higher speed; electrostatic scanning deflectors produce larger deflection off-axis aberrations but can scan with higher speed.

A stereo imaging detection usually is realized by using side detectors as well as an in-lens detector. FIGS. 3a and 3b illustrate two typical side detector arrangements. FIG. 3a shows an arrangement of a side detector which needs a larger working distance and therefore limits the magnetic objective structure which can not produce a strong magnetic field immersion on sample surface, the imaging aberrations are increased due to increasing working distance. FIG. 3b is an arrangement which needs to use pre-lens scanning deflection; however, this arrangement has a large off-axis imaging aberrations.

SUMMARY OF THE INVENTION

The present invention relates to a charged particle beam apparatus which employs a scanning electron microscope for sample inspection and defect review. However, it would be recognized that the invention has a much broader range of applicability.

A system and method in accordance with the present invention improves imaging resolution which is illustrated in several embodiments. One embodiment discloses a field emission cathode with a large tip radius to reduce electron emission current density without reducing angular intensity. Another embodiment discloses applying a large accelerating voltage across ground potential between the cathode and anode to reduce total emission current without reducing angular intensity. Another embodiment positions the beam limit aperture before condenser lens to reduce Coulomb effect generated before beam limit aperture. And yet another embodiment utilizes condenser lens excitation current to optimize image resolution without altering probe current. One other embodiment applies a high positive tube bias to the ground potential and a high negative sample bias to the ground potential to reduce objective aberrations and Coulomb effect. A system and method in accordance with the present invention adopts and modifies the Swing Objective Retarding Immersion Lens (SORIL)/objective lens to ameliorate aberration at large field of view and under electric drifting.

A system and method in accordance with the present invention provides improved throughput during sample inspection, review or material identification by utilizing the fast scanning ability of SORIL and also provides a large voltage difference between sample and detectors. This design makes the secondary electrons impinging on the detector with large kinetic energy, which is better for getting higher detection gain. Thereafter higher signal to noise ratio is provided to benefit image quality.

A system and method in accordance with the present invention provides a solution of topography analysis by adopting and modifying a multi-channels detector. Signals from the different channels can generate a stereo image in combination, finally ensuring a topography analysis of the defects of interest. The system and method can largely reduce on-axis and off-axis aberrations in scanning imaging, and as a result the field of view with high resolution is increased.

The present invention will provide a charged particle beam apparatus which includes an electron beam source, an electron beam column, and a detector unit. The apparatus with high resolution, high throughput, and ability of material identification is suitable for both a defect inspection and review tool.

BRIEF DESCRIPTION OF THE DRAWINGS

The present invention will be readily understood by the following detailed description in conjunction with the accompanying drawings, wherein like reference numerals designate like structural elements, and in which:

FIG. 1 is a schematic diagrammatic representation of a prior art system structure.

FIG. 2 is a schematic diagrammatic representation of another prior art system structure.

FIGS. 3a and 3b illustrate two typical side detector arrangements.

FIG. 4 is a schematic diagrammatic representation of system structure of the first embodiment of the present invention.

FIGS. 5a-5c are the excitation voltages and positions diagrams of the charged particle beam system 400 that operates with magnetic deflectors.

FIG. 6 is a schematic diagrammatic representation of system structure of the secondary embodiment of the present invention.

FIGS. 7a-7c are the excitation voltages and positions diagrams of the charged particle beam system 600 that are operating with electrostatic deflectors.

DETAILED DESCRIPTION OF THE INVENTION

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well known process operations are not described in detail in order not to unnecessarily obscure the present invention.

A charged particle beam apparatus which employs a scanning electron microscope for sample inspection and defect review. The apparatus provides higher imaging resolution, higher throughput and stereo imaging detection. Although this invention is specially designed as a review system, it is also useful as a defect inspection system and a high performance scanning electron microscope (SEM).

There are various methods utilized in order to have the best image resolution by reducing chromatic aberration and decreasing Coulomb interaction between electrons with the primary beam. In the electron source, a ZrO/W field emission cathode chooses a larger tip radius of, for example, being in the range of 1.2 micron to 1.6 micron. The field emission cathode tip is utilized rather than a conventional tip of 0.5 micron. Where a Zr/O field emission cathode is a Schottky type thermal emission source, zirconium oxide is coated on the tungsten emission tip. A larger cathode tip radius in contrast to a conventional tip will introduce less electron density at the cathode tip surface, and thereafter reduce the Coulomb interaction between electrons, with less energy spread of the primary beam at the electron source exit. The drawback of using a larger cathode tip radius is that the virtual source size becomes large and then a large demagnification is needed to get a minimum beam spot on the sample. A large demagnification requires a strong immersion object lens or a longer distance between the cathode tip and the objective lens.

Another way to reduce electron Coulomb interaction is to reduce the number of electrons. One of the embodiments of the present invention positions the beam limit aperture before the condenser lens. This design will trim down beam current to the required small probe current as soon as possible, thus reducing the Coulomb effect. One advantage of this design is that the current of the primary beam after passing aperture will no longer be affected by the condenser lens. Therefore, the imaging resolution with different landing energy and different probe current can be optimized by adjusting condenser excitation current correspondently.

As mentioned above, when the electrons move with higher kinetic energy this will ameliorate aberrations. One of the embodiments of the present invention directly applies a large acceleration voltage between the anode and cathode tip, as Chen et al. describes in a previous disclosed. U.S. patent application Ser. No. 12/130,879, filed in May 30, 2008. The large acceleration voltage, for example 15 KV or more, is applied to the cathode and the anode across the ground potential. This design can raise the negative sample bias to ground potential and reduce the possibility of sample micro-arcing during operation. For example the sample bias to ground potential is raised from −12 KV to −4 KV, when the negative bias on cathode is −7 KV, with 3 KeV landing energy.

One of the embodiments of present invention also adopts another idea disclosed in U.S. patent application Ser. No. 12/130,879 to ameliorate the Coulomb effect by shortening the time that electrons travel. A positive bias to ground potential is applied to the beam tube that guides the primary beam from the electron source through the sample surface. The beam tube bias is the same as or at the vicinity of the anode voltage.

From the objective lens, the present invention adopts an objective lens disclosed by Chen et al. in U.S. Pat. No. 6,392, 231, to ameliorate aberrations. The Swing Objective Retarding Immersion Lens (SORIL) can largely reduce off-axis aberrations in scanning imaging, and as a result the field of view is increased. Although the SORIL can be equipped with electrostatic deflectors or magnetic deflectors, the present invention adopts electrostatic deflectors to enhance throughput of the imaging.

Refer to FIG. 4 and FIG. 6, the controlling electrode 486 and the controlling electrode 686 are made of electrical conduction materials with high magnetic permeability. They are shaped and positioned to be a towards-optical-axis extension of outer polepiece 487 and 687 of the magnetic objective lens 482 and 682 respectively. However, the controlling electrode 486 and 686 are electrically isolated from the outer polepiece 487 and 687 respectively. As controlling electrode, on one hand the controlling electrode 486 and the controlling electrode 686 are set to a voltage Vce to control the electrical field on sample surface lower than the predetermined value, which ensures no sample micro-arcing. A typical predetermined field strength value is 1.8 KV/mm. On the other hand, the voltage Vce of controlling electrode 486 and 686 are dynamically adjusted to compensate the image defocus due to electric drifting. Since imaging a quality picture through electron beam impinges on the sample surface, the system needs to synchronize every component's applied voltage and excitation current. Any electric drifting on these components will cause the spot size of electron beam varied and defocus of the image. The controlling electrode 486 and 686 are dynamically performing micro-focusing while the image is defocused. These controlling electrodes 486 and 686 can increase the magnetic field strength of the SORIL lens under a same excitation current and ameliorate the urgency of enforced cooling, for example, water cooling, of SORIL lens at high excitation current.

To reveal a stereo imaging of the specimen surface with better imaging aberration, the present invention adopts the multi-channels in-column scintillate detector disclosed by Wang et al. in U.S. patent application Ser. No. 11/668,846. The scintillate detector can be replaced by, for example, multi-channels solid state detector (PIN detector) or micro channel plate (MCP) to liberate the working distance. The electrons emanating from the different sides of the sample surface feature are collected by different channels. So signals from the different channels show the surface feature images taken in different directions, and can generate a stereo image in combination, finally ensure a topography analysis of the defects of interest. A typical predetermined field strength value is 1.8 KV/mm.

Examining the excitation voltage and positions diagram can assist in the understanding of a charge particle imaging system. FIG. 4 illustrates the first system 400 structure with magnetic deflectors disclosed in present invention. The electron beam 410 emanating from the cathode tip 420 is accelerated by anode 430 voltage, passes through gun aperture 440, beam limit aperture 442, beam tube 450, condenser lens 460 and modified SORIL lens 480, and then impinges onto the sample surface 490. The modified SORIL lens 480 includes magnetic objective lens 482, magnetic deflectors 484 which are located outside the beam tube 450, and the modified controlling electrode 486. The secondary electrons 412 emanated from sample surface 490 are collected by the multi-channels detector 470 to form a stereo image of the interest area. For material identification, the X-ray 414 generated from the position that is impinged by the electron beam 410 is collected by energy dispersive spectrometer (EDS) detector 472 to reveal material characteristics.

FIGS. 5a-5c are the excitation voltages and positions diagrams of the charged particle beam system 400 that operates with magnetic deflectors. The first example illustrated in FIG. 5a is an example of inspecting or reviewing a sample. The beam accelerating voltage 15 KV is applied to cathode Vc and anode Va across the ground potential 0V. The beam tube bias Vb may be set at the same as what the anode has. To avoid sample surface damaged by impinging electron beam, the beam is decelerated after exiting beam tube by control electrode voltage Vce and the sample surface bias Vs to achieve the predetermined landing energy for example 0.5 KeV to 5 KeV. To perform material analysis through energy dispersive spectrometer (EDS) while identifying the chemical composition of a defect, electron landing energy on the defect is set at 10 KeV and 15 KeV respectively, and the sample surface bias is set 0V. FIG. 5b illustrates an example of excitation voltage distribution while performing EDS analysis at 10 KeV landing energy requirement and FIG. 5c illustrates an example of excitation voltage distribution while performing EDS analysis at 15 KeV landing energy requirement according to one embodiment of the present invention.

FIG. 6 illustrates the second system 600 structure with the electrostatic deflectors disclosed in present invention. The electron beam 610 emanated from cathode tip 620 is accelerated by anode 630 voltage, then passes through gun aperture 640, beam limit aperture 642, a shorten beam tube 650, condenser lens 660 and modified SORIL lens 680, and then impinges onto the sample surface 690. The modified SORIL lens 680 includes magnetic objective lens 682, electrostatic deflectors 684 which are located inside the central bore of magnetic objective lens 682, and the modified controlling electrode 686. The secondary electrons 612 emanated from sample surface 690 are collected by the multi-channels detector 670 to form a stereo image of the interest area. For material identification, the X-ray 614 generated from the position that impinged by the electron beam 610 is collected by EDS detector 672 to reveal material characteristics.

FIGS. 7a-7c are the excitation voltages and positions diagrams of the charged particle beam system 600 that are operating with electrostatic deflectors. The first example illustrates in FIG. 7a is an example of inspecting or reviewing a sample. The beam accelerating voltage 15 KV is applied to cathode Vc and anode Va across the ground potential 0V. The beam tube bias Vb may be set at the same voltage as what the anode has. The electrostatic deflectors 684 are more easily excited while operating at the ground bias. To avoid a sample surface damaged by impinging electron beam, the beam is decelerated again after exiting magnetic objective lens 682 by the control electrode Vce and the sample surface bias Vs to achieve the predetermined landing energy, for example, 0.5 KeV to 5 KeV. To perform material analysis through EDS while identifying the chemical composition of a defect electron, landing energy on the defect is set 10 KeV and 15 KeV respectively, and the sample surface bias is set on 0V. FIG. 7b illustrates an example of excitation voltage distribution while performing EDS analysis at 10 KeV landing energy requirement, and FIG. 7c illustrates an example of excitation voltage distribution while performing EDS analysis at 15 KeV landing energy requirement according to one embodiment of the present invention.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended.

What is claimed is:

1. A charged particle beam apparatus which employs a scanning electron microscope for sample inspection and defect review, comprising:
    a primary particle beam source for generating a primary particle beam, wherein the primary electron beam source has a ZrO/W field emission cathode (cathode);
    an accelerating electrode (anode) for accelerating generated primary electron beam;
    a beam limit aperture for adjusting preferred probe current;
    a condenser lens to condense the primary particle beam;
    a beam tube with a positive bias to ground potential to guide primary beam toward sample to be inspected;
    a SORIL type objective lens system for focusing the primary electron beam into an electron beam probe;
    a sample to be inspected with a negative bias to ground potential; and
    a detection system for detecting secondary electrons and x-ray emanating from sample upon being impinged by the electron beam probe.

2. The apparatus of claim 1, wherein the tip radius of the ZrO/W field emission cathode tip is equal to or larger than 1.0 micron.

3. The apparatus of claim 1, wherein the tip radius of the ZrO/W field emission cathode tip is in a range between 1.2 and 1.6 micron.

4. The apparatus of claim 1, wherein the cathode has a negative bias to ground potential.

5. The apparatus of claim 1, wherein the anode has a positive potential to ground potential.

6. The apparatus of claim 1, wherein the voltage difference between accelerating electrode and field emission cathode is equal to or larger than 10 KV.

7. The apparatus of claim 1, wherein the voltage difference between accelerating electrode and field emission cathode is equal to or larger than 15 KV.

8. The apparatus of claim 1, wherein the beam limit aperture is positioned in front of condenser lens.

9. The apparatus of claim 1, wherein the beam tube is set to the anode voltage.

10. The apparatus of claim 1, wherein the beam tube is set to the vicinity of anode voltage.

11. The apparatus of claim 1, wherein the sample bias voltage to ground potential is equal to or lower than −4 KV and higher than the cathode voltage when not operating with EDS.

12. The apparatus of claim 1, wherein the SORIL type objective lens system comprises:
- a magnetic lens for generating a magnetic field in the vicinity of sample to focus the electron beam probe onto the sample, the magnetic lens having a central bore through which the electron beam travels;
- a controlling electrode with positive bias to the sample voltage for controlling the retarding electrical field on sample surface lower than the value which ensures no sample micro-arcing and dynamically performing micro-focusing while the image is defocused; and
- a deflection system for deflecting the electron beam probe to allow scanning of the sample.

13. The apparatus of claim 12, wherein the value of retarding electrical field on sample surface to ensure no sample micro-arcing is 1.8 KV/mm.

14. The apparatus of claim 12, wherein the controlling electrode is made of electrical conduction materials with high magnetic permeability.

15. The apparatus of claim 12, wherein the controlling electrode is a towards-optical-axis extension of outer polepiece of the magnetic objective lens.

16. The apparatus of claim 12, wherein the controlling electrode has a function to provide no enforced cooling while operating with EDS.

17. The apparatus of claim 12, wherein the controlling electrode is electrically isolated from the outer polepiece of the magnetic objective lens.

18. The apparatus of claim 1, wherein the detecting system further comprises:
- a detector for detecting secondary electrons emanating from sample upon being impinged by the electron beam probe; and
- a detector for detecting x-ray emanating from sample upon being impinged by the electron beam probe.

19. The apparatus of claim 18, where the detector for detecting secondary electrons is a multi-channels detector for revealing stereo image.

20. The apparatus of claim 18, where the detector for detecting x-ray is Energy Dispersive Spectrometer (EDS) detector for material identification.

* * * * *